(12) United States Patent
Wolfe

(10) Patent No.: US 8,370,307 B2
(45) Date of Patent: Feb. 5, 2013

(54) CLOUD DATA BACKUP STORAGE MANAGER

(75) Inventor: Andrew Wolfe, Los Gatos, CA (US)

(73) Assignee: Empire Technology Development LLC, Wilmington, DE (US)

( * ) Notice: Subject to any disclaimer, the term of this patent is extended or adjusted under 35 U.S.C. 154(b) by 456 days.

(21) Appl. No.: 12/551,790

(22) Filed: Sep. 1, 2009

(65) Prior Publication Data

US 2011/0055161 A1    Mar. 3, 2011

(51) Int. Cl.
*G06F 7/00* (2006.01)
*G06F 17/00* (2006.01)

(52) U.S. Cl. .................... 707/652; 709/219; 380/277

(58) Field of Classification Search .................. None
See application file for complete search history.

(56) References Cited

U.S. PATENT DOCUMENTS

| | | | | |
|---|---|---|---|---|
| 5,846,860 A * | 12/1998 | Shih et al. ................ | | 438/253 |
| 7,788,211 B2 * | 8/2010 | Le et al. .................... | | 370/252 |
| 7,937,379 B2 * | 5/2011 | Ganesan et al. ............ | | 707/705 |
| 2008/0082870 A1 * | 4/2008 | Park ........................... | | 714/704 |
| 2008/0126357 A1 * | 5/2008 | Casanova et al. ........... | | 707/10 |
| 2010/0293147 A1 * | 11/2010 | Snow et al. ................. | | 707/640 |

OTHER PUBLICATIONS

Morelos-Zaragoza, R.H., "The Art of Error Correcting Coding," Second Edition, John Wiley & Sons, 2 pages, 2006, updated Dec. 4, 2007.

* cited by examiner

*Primary Examiner* — Loan T Nguyen

(57) ABSTRACT

Techniques for cloud data backup are disclosed. Example methods may store backup data from a client computer on portions of data storage media associated with peer computers. In some example embodiments, a file may be encoded into segments using an error-tolerant encoding scheme, and the segments may be stored on peer computers. In some example embodiments, individual segments may be stored on more than one peer machine and/or an individual peer machine may not receive all of the segments associated with the file.

23 Claims, 6 Drawing Sheets

--- identifying at least one file to be backed up, where the file is stored locally on a client computer — 202 encoding the file into K file segments, where K is an integer greater than one — 204 requesting at least R*K storage blocks on a plurality of peer computers, where R is a redundancy factor — 206 transmitting individual segments from the client computer to the plurality of peer computers such that each of the K segments is stored on at least R peer computers — 208

CLOUD DATA BACKUP STORAGE MANAGER

BACKGROUND

The present disclosure is directed to data backup and, more particularly, to cloud data backup.

BRIEF DESCRIPTION OF THE DRAWINGS

The foregoing and other features of the present disclosure will become more fully apparent from the following description and appended claims, taken in conjunction with the accompanying drawings. Understanding that these drawings depict only several embodiments in accordance with the disclosure and, therefore, are not to be considered limiting of its scope, the disclosure will be described with additional specificity and detail through use of the accompanying drawings.

In the drawings.

DETAILED DESCRIPTION

Figure 1:
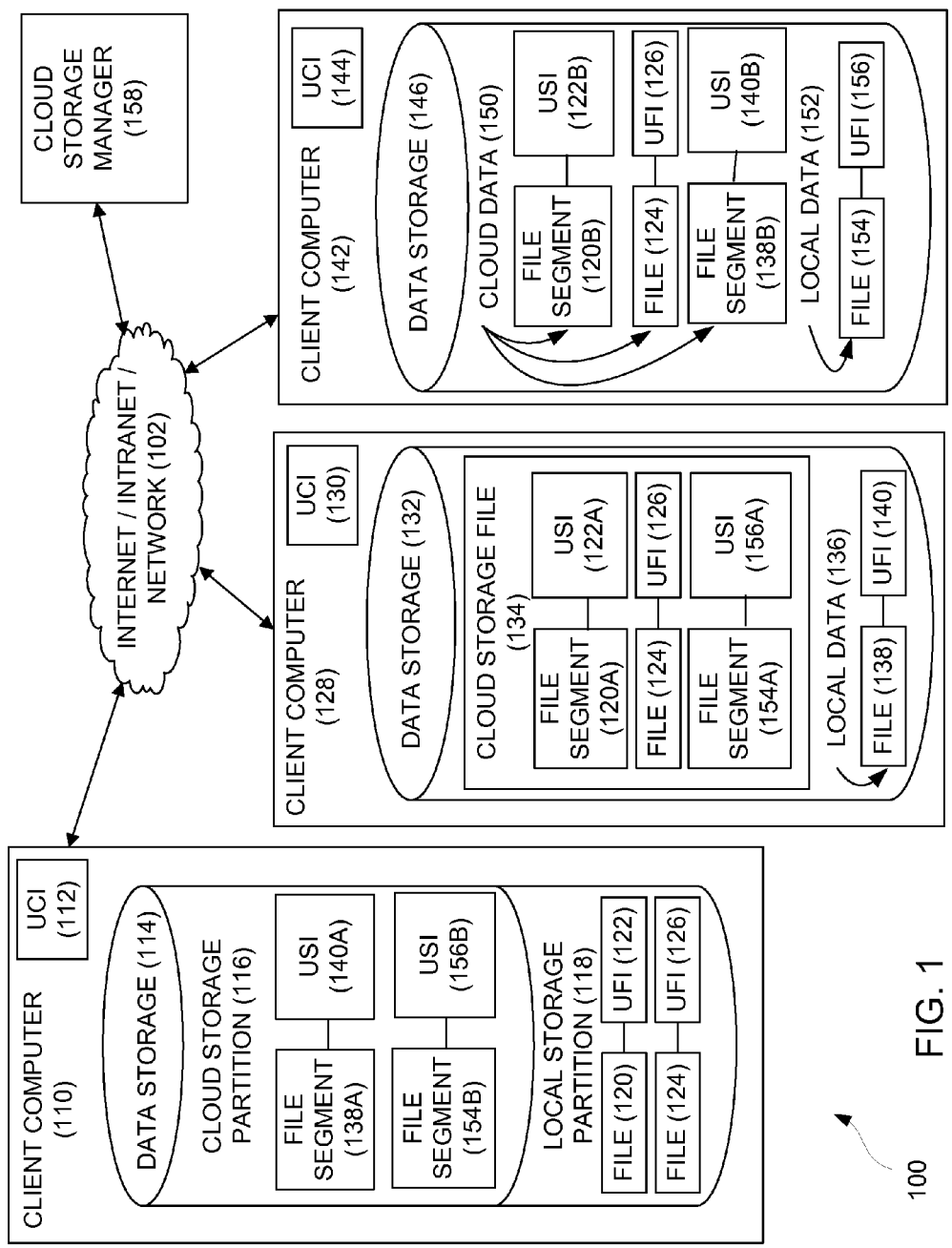
FIG. 1 is a schematic diagram of an example data backup storage cloud.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, may be arranged, substituted, combined, and designed in a wide variety of different configurations, all of which are explicitly contemplated and make part of this disclosure.

This disclosure is drawn, inter alia, to methods and systems related to data backup and, more particularly, to cloud data backup.

The present disclosure contemplates that data backup may be useful in many contexts, such as in enterprise computing systems. Developing and maintaining data backup strategies for computers, such as desktop computers, may be a complex and/or expensive task, particularly in a large enterprise context. In some enterprise computing systems, users may store critical data on local PCs (personal computers, such as desktop computers, laptop computers, and/or tablet computers) and the data may be periodically backed up to guard against data loss resulting from the failure of a low-reliability PC. For example, backup data may be copied from individual PCs to a central backup server. However, to prevent a failure in the backup server from causing a catastrophic loss of data, the backup server may incorporate a high degree of redundancy and may provide high availability. This may involve potentially expensive RAID (redundant array of inexpensive disks, which may include a system of multiple hard drives for sharing or replicating data) storage systems and/or redundant servers with potentially expensive backup power supplies. These systems may have substantial performance bottlenecks, including limited network bandwidth. Also, to provide appropriate read/write bandwidth in a disk storage system, backup servers may use a large number of relatively small, high-speed drives. This may involve a much higher cost per unit of data storage than high-volume, low-cost drives that may be supplied with PCs. Centralized backup servers may also introduce some risk of data loss due to physical damage (fire, flood, etc.) if they are in a single location. Further, centralized backup servers may pose a risk of physical data theft unless the data is reliably encrypted.

The present disclosure contemplates that some computer systems, such as enterprise computer systems (and/or other networked computer systems), may include a great abundance of available storage in the form of the unused capacity in the individual data storage devices installed in computers associated with the system. For example, a single platter on an example 3.5" drive may store 320 GB, which may be far more than a typical office worker utilizes for personal storage, especially if policies limit the use of employer PCs for personal use. Further, terabyte disks for desktop machines are available and may soon become common. Thus, the present disclosure contemplates that the unused storage capacity in the data storage devices of computers on a network may be utilized for storage of backup data.

BRIEF SUMMARY OF THE INVENTION

In some examples, a cloud data backup storage manager may use a network to store user backup data on a plurality of client computers. In some examples, a cloud data backup storage manager may restore user data using a network to access backed up data at a plurality of client computers. Cloud backup reduces the risk of physical data theft, uses otherwise unused available storage in the form of unused capacity in the individual data storage devices installed in the computers associated with the system, and prevents catastrophic loss of data, among other disclosed advantages.

FIG. 1 is a schematic diagram of an example backup data storage cloud 100 according to the present disclosure. A plurality of client computers 110,128,142 (which may include personal computers such as PCs and which may be considered to be peers in some example embodiments) may be operatively connected via a network 102, such as an intranet, the Internet, and/or any other form of a wired and/or wireless data network. Unique client identifiers (UCIs) 112, 130, 144 may be associated with and/or may uniquely identify client computers 110, 128, 142. Client computers 110, 128, 142 may include one or more data storage devices 114, 132, 146 (e.g., hard drives and/or any other removable and/or nonremovable data storage media). Some data storage devices 114, 132, 146 may include one or more cloud storage partitions 116, one or more local storage partitions 118, one or more cloud storage files 134, local data 136, 152, and/or cloud data 150. Client computers 110, 128, 142 may include locally stored files 120, 124, 138, 154 on data storage devices 114, 132, 146. Unique file identifiers (UFIs) 122, 126, 140, 156 may be associated with and/or may uniquely identify locally stored files 120, 124, 138, 154. One or more backup copies of locally stored files 120, 124, 138, 154 and/or portions thereof may be stored on one or more data storage devices 114, 132, 146 associated with another client computer 110, 128, 142. For example, cloud storage partition 116 associated with client computer 110 may include file segment 138A (with USI 140A) and file segment 154B (with USI 156B), which may include portions of locally stored files 138, 154. Likewise, cloud storage file 134 associated with client computer 128 may include file segments 120A, 154A (with USIs 122A, 156A) and file 124, and cloud data 150 associated with client computer 142 may include file segments 120B, 138B (with USIs 122B, 140B) and file 124. A cloud storage manager 158 may be operatively connected to individual client computers 110, 128, 142 via network 102 and/or may be responsive to requests from users, for example.

In an example embodiment, a data backup storage cloud 100 may use one or more client computers' hard drives 114, 132, 146 (and/or any other data storage media) throughout an enterprise computing system (and/or any other networked computer system) to store backup data associated with files 120, 124, 138, 154 stored locally on individual client computers' hard drives 114, 132, 146. In this manner, an example embodiment may employ a software-based backup solution that may utilize existing storage, existing distributed networks, and/or existing computers to provide reliable and secure backups.

In some example embodiments, a storage device 114, 132, 146 (e.g., a hard drive) associated with an individual client computer 110, 128, 142 may be partitioned into local storage 118 and cloud storage 116. This may be accomplished by physical and/or logical partitioning of the data storage device 114, by creating one or more cloud files (such as cloud storage file 134 on data storage device 132), or by any other method of allocating storage capacity statically or dynamically between local and cloud storage. An example cloud file 134 may include backup data 120A, 124, 154A associated with one or more files stored locally on another client computer 110, 142, but may be stored on an individual client computer 128 as a single file 134 or a portion thereof. A local storage partition 118 and/or local storage data 136, 152 may be available to a user of an individual client computer 110, 128, 142 in a conventional manner. Further, in some example embodiments, one or more client computers 110, 128, 142 may include one or more dedicated cloud storage devices (e.g., hard drives).

In some example embodiments, various operations of a data backup storage cloud 100 may be managed by a cloud storage manager 158. Similarly, in some example embodiments, one or more client computers 110, 128, 142 may be configured to run a cloud storage manager service which may be responsive to requests from the network, such as by using an open network port dedicated to that service. The cloud storage manager may be replicated or distributed in order to avoid a single point of failure.

In an example embodiment, unique client identifiers (UCIs) 112, 130, 144 may be associated with and/or may uniquely identify individual client computer 110, 128, 142. For example, the MAC (media access control) address of the primary Ethernet port of a client computer 110, 128, 142 may be used as a unique client identifier. Similarly, the unique processor ID of the first processor may be used. These potential unique client identifiers are merely illustrative and are not limiting, and any other appropriate identifier may be utilized in example embodiments. In some example embodiments, the UCI 112, 130, 144 may be securely recorded in a location separate from the client machine 110, 128, 142 to assist in data recovery in the event that the client 110, 128, 142 is destroyed.

In an example embodiment, unique file identifiers (UFIs) 122, 126, 140, 156 may be associated with and/or may uniquely identify individual files 120, 124, 138, 154. For example, this information may be available from the file system, such as the complete file path on the client computer 110, 128, 142. The UFI 122, 126, 140, 156 may include a version indication (such as a timestamp indicating the last modification time) that may identify a unique version of the file. These potential unique file identifiers are merely illustrative and are not limiting, and example embodiments may utilize any appropriate identifiers. An example UFI may include data associated with a UCI 112, 130, 144, and/or any other identifying information. In some embodiments, unique file identifiers may comprise unique numbers from a sequence which may be requested from the cloud storage manager, cloud storage manager service, or any other computer providing an identifier service. In some embodiments, unique file identifiers may be generated from the local file system volume ID and the file creation time, for example. In some embodiments, unique file identifiers may be assigned to the file sequentially at the time of file creation.

In an example embodiment, a unique segment identifier (USI) 122A, 122B, 140A, 140B, 156A, 156B may be associated with and/or may uniquely identify individual file segments 120A, 120B, 138A, 138B, 154A, 154B. An example USI 122A, 122B, 140A, 140B, 156A, 156B may include data associated with a UCI 112, 130, 144, a UFI 122, 126, 140, 156, and/or any other identifying information.

Figure 2:
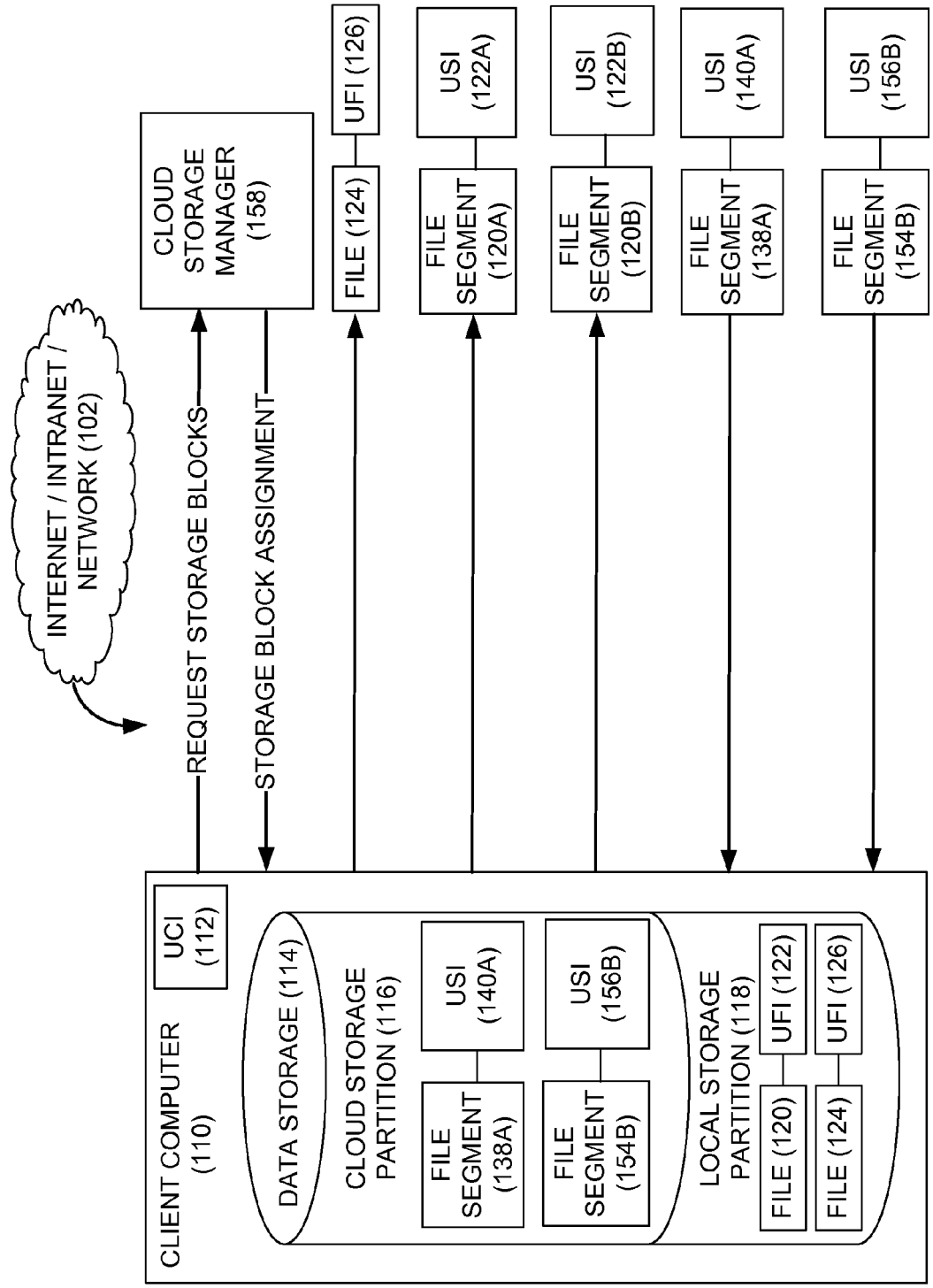
FIG. 2 is a simplified signal flow diagram depicting data flow associated with a client computer in an example data backup storage cloud.

FIG. 2 is a simplified signal flow diagram depicting example data flow associated with a client computer 110 in an example data backup storage cloud 100. In an example embodiment, a client computer 110 may transmit a request for storage blocks to the cloud storage manager 158. The cloud storage manager 158 may reserve and/or assign storage blocks, and may transmit the assignment to the client computer 110. The client computer 110 may transmit one or more files 124 and/or file segments 120A, 120B to one or more peer computers 128, 142. These files 124 and/or file segments 120A, 120B may be copies (backups) of files/segments existing on the client computer 110. Similarly, a client computer 110 may receive backup data in the form of one or more file segments 138A, 154A and/or files from one or more peer computers 128, 142.

In an example embodiment, an individual client computer 110 may initiate a backup operation for copying one or more local files 120, 124 for backup to one or more peer machines 128, 142 in the cloud 100. A set of files to be backed up may be identified, such as a set of folders and/or partitions, files created after a certain date, files modified since the last backup, and/or using any other criteria that a user, an administrator, and/or the system may establish.

In an example embodiment, one or more files may be encoded into a redundant, error-tolerant format including K segments, where K is an integer greater than one. Any suitable error prevention technique may be employed. For example, each byte of a file may be encoded into a 12-bit Hamming-type code that may tolerate multiple bit errors. Thus, the file may be formed into 12 segments, where individual segments may include one bit from each byte in the original file. In some example embodiments, other suitable encoding mechanisms such as Reed-Solomon codes, Turbo codes, etc. may be used. Each segment may also include an error-checking code, such as a CRC (cyclic redundancy check) or similar signature field that may be checked to determine internal integrity. The present disclosure contemplates that details about error detection and correction codes can be found, for example, in "The Art of Error Correcting Coding" by Robert H. Morelos-Zaragoza.

In an example embodiment, a redundancy factor R may be established based on the stability, availability, and/or variability of the machines in the cloud 100. The redundancy factor R may be employed to determine the number of redundant copies of each backup file or segment that may be stored in the backup data storage cloud 100. For example, in a stable, highly reliable computer system, a redundancy factor of two may be utilized, thus indicating that locally stored files 120, 124, 138, 154 may be backed up on two peer computers 110, 128, 142. Similarly, in a computing system which may be unreliable and/or in which some peer devices 110, 128, 142 may become unavailable, a redundancy factor of ten may be utilized to increase the probability that at least one backup copy of each file or segment will be available if data restoration is required.

In an example embodiment, a client 110, 128, 142 may send a request to one or more cloud storage managers 158 and/or peer computers 110, 128, 142, requesting reservation and/or assignment of at least R*K storage blocks of an appropriate size. The request may be made using any appropriate mechanism, such as peer-to-peer communication methods (similar to BitTorrent, etc.), broadcast messages, a centralized cloud server that maintains and provides a list of candidates, a locally managed list of candidates, a pre-established set of candidates, and/or a distributed system by which one of the prior methods can be used to request lists of candidates.

In an example embodiment, a client 110, 128, 142 may receive an acknowledgement indicating that storage blocks have been assigned for its backup operation. An example acknowledgement may include identifying information, such as UCIs 112, 130, 144 for the relevant peers. If fewer than R*K segments are assigned, the client computer 110, 128, 142 may transmit additional requests and/or compare the number of segments to P*K, where P<R and where P may be an adequate, but less desirable redundancy factor. Similarly, If fewer than R peers are assigned, the client computer 110, 128, 142 may transmit additional requests and/or compare the number of peers to P, where P<R and where P may be an adequate, but less desirable redundancy factor. In either such case, the actual number of peers assigned can be used instead of the value R in the disclosed systems and methods.

In an example embodiment, the client computer 110, 128, 142 may send to individual peers 110, 128, 142 one or more of the K segments accompanied by a USI, a UFI, and/or a UCI, such that R copies of each segment may be stored on different peer computers 110, 128, 142. These segments may be stored by the peers 110, 128, 142 and successful completion of the storage operation may be reported.

In accordance with the present disclosure, some example embodiments may provide redundancy via duplication (storing backup data on R peers) and/or via error correction (individual files and/or segments may include error-correcting code). Thus, in some example embodiments, if one of the peer computers 110, 128, 142 becomes unavailable, the data may be reconstructed without data loss.

In an example embodiment, if any transfer is not acknowledged, it may be retried until successful, sent to another peer 110, 128, 142 (which may be requested and/or reserved), and/or may determined to be sacrificial (for example, where P copies of that segment have been acknowledged).

In an example embodiment, the requesting and storing may be repeated for a plurality of files and/or for a plurality of client computers 110, 128, 142.

In an example embodiment, to recover a file, the backup cloud 100 may be queried using a query which may include a UFI 122, 126, 140, 156, a USI 122A, 122B, 140A, 140B, 156A, 156B, and/or a UCI 112, 130, 144, for example. Cloud peers 110, 128, 142 may respond that they have one or more files 124 and/or file segments 120A, 120B, 138A, 138B, 154A, 154B, and may provide the UFIs 126 and/or USIs 122A, 122B, 140A, 140B, 156A, 156B. The segments 120A, 120B, 138A, 138B, 154A, 154B may be provided to the client computer 110, 128, 142 proactively and/or upon the request of the client computer 110, 128, 142. In some example embodiments, the CRC or other integrity check of each segment may be verified.

In an example embodiment, a copy of each of the K segments 120A, 120B, 138A, 138B, 154A, 154B may be reassembled into the original file 120, 138, 154. If any segment 120A, 120B, 138A, 138B, 154A, 154B may not be recovered in a timely manner, the error correction code may be used to reconstruct the file without the missing segment 120A, 120B, 138A, 138B, 154A, 154B.

In an alternative example embodiment, individual files 120, 124, 138, 154 may be broken into a sequence of blocks (subfiles). Each subfile may be deconstructed into segments as described above. The subfile segments may be stored on cloud machines as described above. Various segments related to a file may be stored on different clients. USIs may identify the place in the original file where the segment belongs. The original file may be reassembled from the various subfile segments.

An example embodiment may perform a cloud availability scrubbing function, and, in some embodiments, a client computer 110, 128, 142 may include a cloud availability scrubber for ensuring that adequate copies of individual file segments 120A, 120B, 138A, 138B, 154A, 154B are available on the cloud 100. An example cloud availability scrubber may, for individual files of interest from the set of files stored in the cloud, query the cloud to determine the number of accessible and verifiable copies of individual segments. If any segment does not have R available copies, the scrubber may request and reserve space for additional copies and/or may create additional copies on the cloud so that R copies are currently available.

In some example embodiments, encryption may be used on the files, segments, and/or on the network links. For example, encryption may be employed in an example embodiment utilized in connection with a network 102 that may not be acceptably secure.

In some example embodiments, a cloud storage manager 158 and/or a cloud storage manager service running on a client computer 110, 128, 142 may implement a security scheme such as a password, a query-response process, a decryption key, and/or another authentication protocols before responding to queries.

In some example embodiments, a central and/or distributed database may be maintained to track the location of individual files and/or segments. Such a database may be utilized in place of or in addition to tagging each file and/or segment. Such a database may be maintained by the cloud storage manager 158, for example.

In some example embodiments, a two-dimensional and/or a multi-dimensional encoding scheme may be utilized in addition to or in place of using replication along with an error code. In such a case, a scrubbing process may restore an encoded segment (rather than restoring copies) and a reconstruction process may reconstruct a file from the available pieces of the encoded file rather than copies of the individual segments. In such an embodiment, the individual bits or data words (e.g., fixed-sized groups of that are handled together by the computer) of one or more segments may be arranged in an array of 2 or more dimensions. Error correction codes may be created along each axis of this array. The resulting array, including the original data and the error correction data may then be repartitioned into segments to be distributed among clients. In some embodiments, this repartitioning may take place along a different array axis for each of several redundant copies. If a portion of this data is lost, it may be reconstructed using error correction codes from an orthogonal axis of the data array. Similarly, a scrubbing process may repeatedly reconstruct lost data using this method and may reallocate storage for the reconstructed data.

In some example embodiments, individual clients (other than the originator of a file) may not store a complete copy of an individual file. Thus, even with advanced decryption technology, an individual client may not be able to obtain a complete copy of the file. In some example embodiments, this aspect may reduce the importance of encryption because, even without encryption, individual peers may be unable to reconstruct a complete copy of the file.

In some example embodiments, an originator of a file may not need to know on which other client computers the backup data may be stored. Similarly, in some example embodiments, client computers designated to receive the backup data may be chosen automatically. Thus, a user of a client computer originating a file may not need to authorize or identify particular backup storage providers. In some example embodiments, all or substantially all client computers within a network or sub-network may be available to store backup data.

In some example embodiments, backup files on remote computers may be stored on partitions that may not be readily accessible and/or managed by the users of that computer (other than a system administrator). In some example embodiments, such an aspect may be implemented in an enterprise computing environment.

Figure 3:
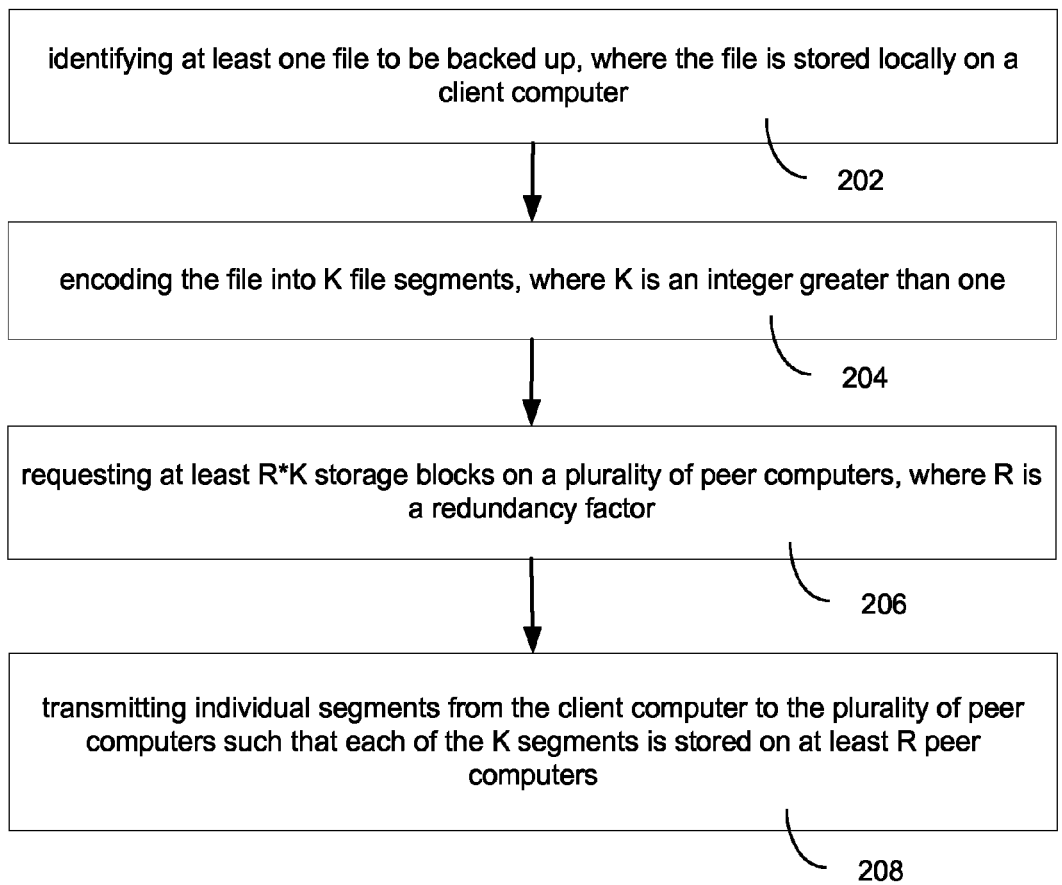
FIG. 3 is a block diagram depicting an example method of backing up data.

FIG. 3 is a block diagram depicting an example method of backing up data performed by a client computer. Operation 202 may include identifying at least one file to be backed up, where the file is stored locally on a client computer. Operation 204 may include encoding the file into K file segments, where K is an integer greater than one. Operation 206 may include requesting at least R*K storage blocks on a plurality of peer computers, where R is a redundancy factor. Operation 208 may include transmitting individual segments from the client computer to the plurality of peer computers such that each of the K segments is stored on at least R peer computers.

Figure 4:
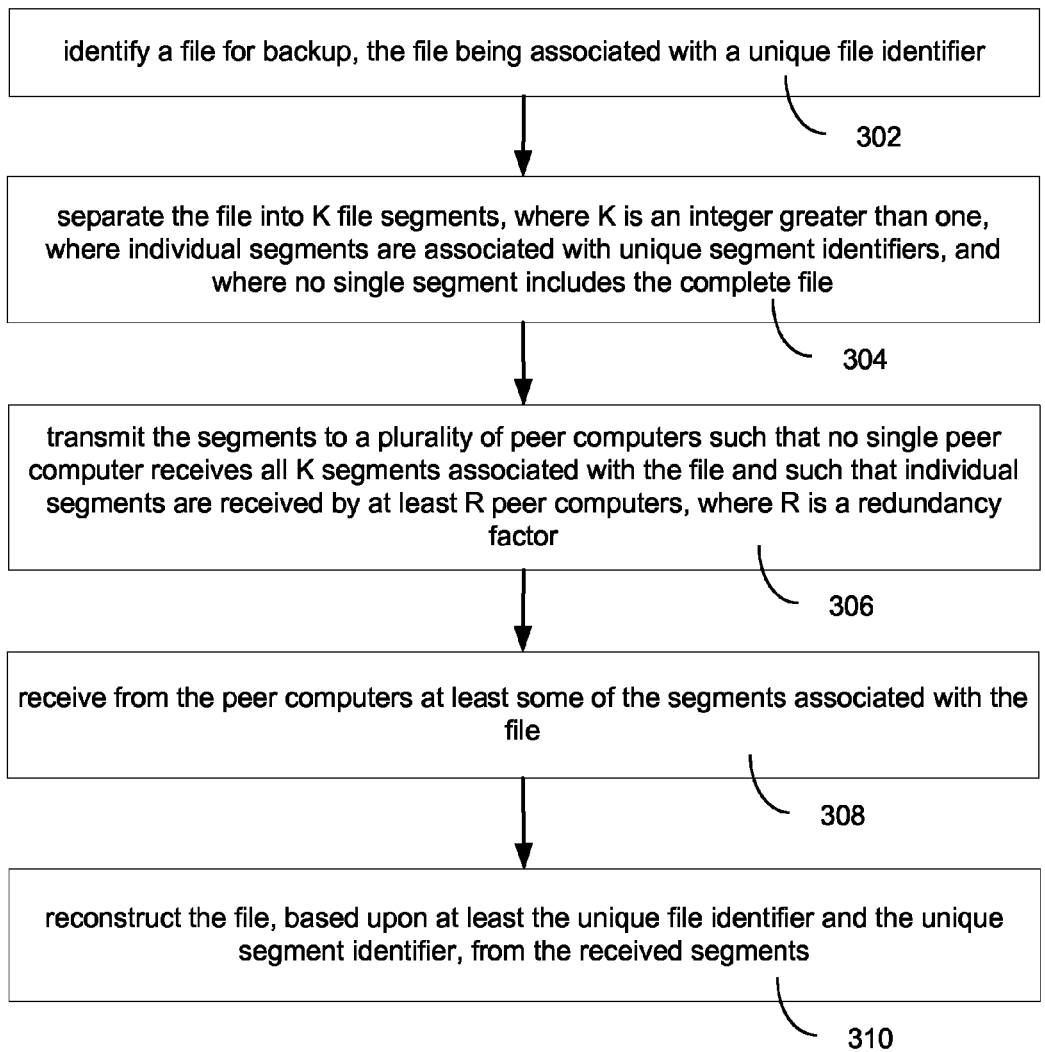
FIG. 4 is a block diagram depicting an illustrative method of operating a client computer in an example data backup cloud.

FIG. 4 is a block diagram depicting an illustrative method of operating a client computer in an example data backup cloud. Operation 302 may identify a file for backup, the file being associated with a unique file identifier. Operation 304 may separate the file into K file segments, where K is an integer greater than one, where individual segments are associated with unique segment identifiers, and where no single segment includes the complete file. Operation 306 may transmit the segments to a plurality of peer computers such that no single peer computer receives all K segments associated with the file and such that individual segments are received by at least R peer computers, where R is a redundancy factor. Operation 308 may receive from the peer computers at least some of the segments associated with the file. Operation 310 reconstruct the file, based upon at least the unique file identifier and the unique segment identifier, from the received segments.

Figure 5:
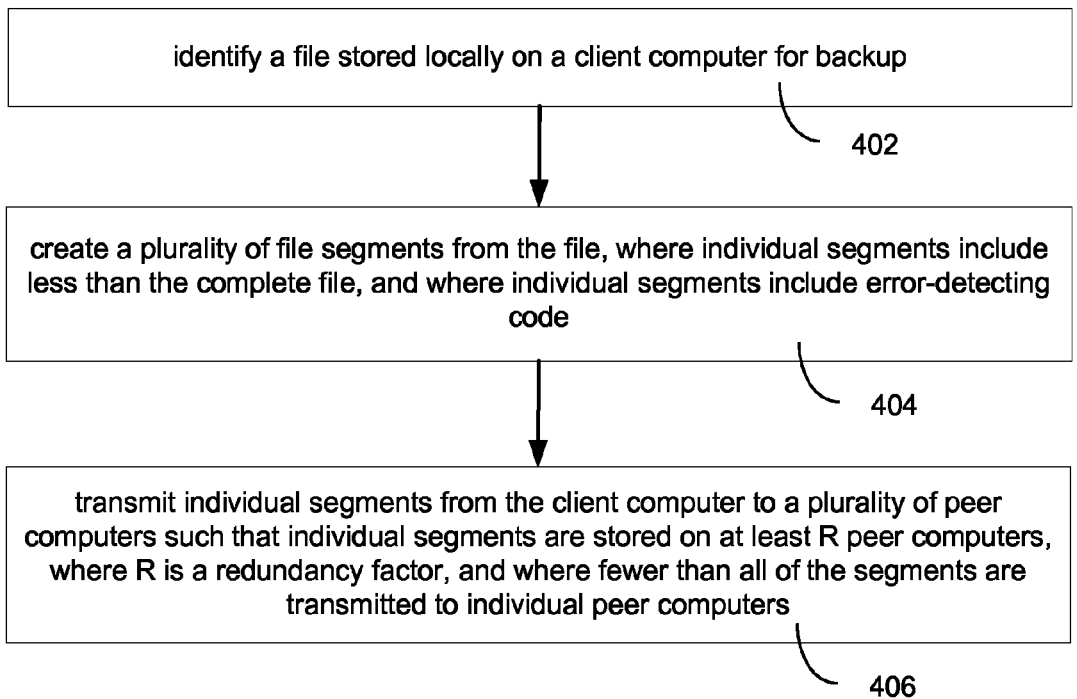
FIG. 5 is a block diagram depicting an illustrative method of operating a cloud data backup system.

FIG. 5 is a block diagram depicting an illustrative method of operating a cloud data backup system. Operation 402 may identify a file stored locally on a client computer for backup. Operation 404 may create a plurality of file segments from the file, where individual segments include less than the complete file, and where individual segments include error-detecting code. Operation 406 may transmit individual segments from the client computer to a plurality of peer computers such that individual segments are stored on at least R peer computers, where R is a redundancy factor, and where fewer than all of the segments are transmitted to individual peer computers.

Figure 6:
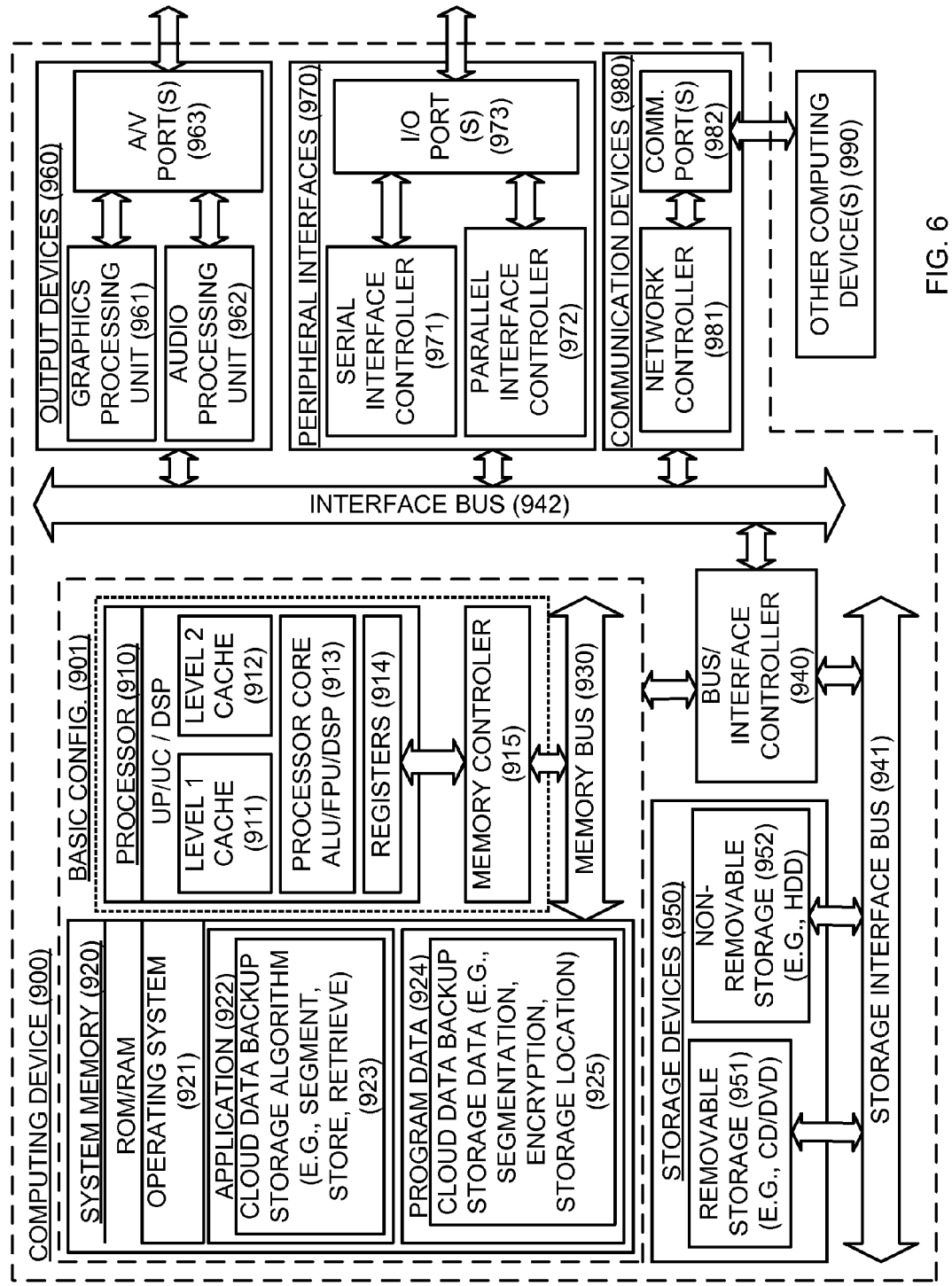
FIG. 6 is a block diagram illustrating an example computing device that may be arranged for cloud data backup implementations, all configured in accordance with at least some embodiments of the present disclosure.

FIG. 6 is a block diagram illustrating an example computing device 900 that is arranged for cloud data backup in accordance with the present disclosure. In a very basic configuration 901, computing device 900 typically includes one or more processors 910 and system memory 920. A memory bus 930 can be used for communicating between the processor 910 and the system memory 920.

Depending on the desired configuration, processor 910 can be of any type including but not limited to a microprocessor ($\mu$P), a microcontroller ($\mu$C), a digital signal processor (DSP), or any combination thereof. Processor 910 can include one more levels of caching, such as a level one cache 911 and a level two cache 912, a processor core 913, and registers 914. The processor core 913 can include an arithmetic logic unit (ALU), a floating point unit (FPU), a digital signal processing core (DSP Core), or any combination thereof. A memory controller 915 can also be used with the processor 910, or in some implementations the memory controller 915 can be an internal part of the processor 910.

Depending on the desired configuration, the system memory 920 can be of any type including but not limited to volatile memory (such as RAM), non-volatile memory (such as ROM, flash memory, etc.) or any combination thereof. System memory 920 typically includes an operating system 921, one or more applications 922, and program data 924. Application 922 includes a cloud data backup storage algorithm 923 that is arranged to store backup data in a data backup cloud. Program Data 924 includes cloud data backup storage data 925 that is useful for backing up data in a cloud backup data storage implementation, as will be further described below. In some embodiments, application 922 can be arranged to operate with program data 924 on an operating system 921 such that backup data may be stored on a backup data storage cloud. This described basic configuration is illustrated in FIG. 6 by those components within dashed line 901.

Computing device 900 can have additional features or functionality, and additional interfaces to facilitate communications between the basic configuration 901 and any required devices and interfaces. For example, a bus/interface controller 940 can be used to facilitate communications between the basic configuration 901 and one or more data storage devices 950 via a storage interface bus 941. The data storage devices 950 can be removable storage devices 951, non-removable storage devices 952, or a combination thereof. Examples of removable storage and non-removable storage devices include magnetic disk devices such as flexible disk drives and hard-disk drives (HDD), optical disk drives such as compact disk (CD) drives or digital versatile disk (DVD) drives, solid state drives (SSD), and tape drives to name a few. Example computer storage media can include volatile and nonvolatile, removable and non-removable media implemented in any method or technology for storage of information, such as computer readable instructions, data structures, program modules, or other data.

System memory 920, removable storage 951 and non-removable storage 952 are all examples of computer storage media. Computer storage media includes, but is not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by computing device 900. Any such computer storage media can be part of device 900.

Computing device 900 can also include an interface bus 942 for facilitating communication from various interface devices (e.g., output interfaces, peripheral interfaces, and communication interfaces) to the basic configuration 901 via the bus/interface controller 940. Example output devices 960 include a graphics processing unit 961 and an audio processing unit 962, which can be configured to communicate to various external devices such as a display or speakers via one or more A/V ports 963. Example peripheral interfaces 970 include a serial interface controller 971 or a parallel interface controller 972, which can be configured to communicate with external devices such as input devices (e.g., keyboard, mouse, pen, voice input device, touch input device, etc.) or other peripheral devices (e.g., printer, scanner, etc.) via one or more I/O ports 973. An example communication device 980 includes a network controller 981, which can be arranged to facilitate communications with one or more other computing devices 990 over a network communication via one or more communication ports 982. The communication connection is one example of a communication media. Communication media may typically be embodied by computer readable instructions, data structures, program modules, or other data in a modulated data signal, such as a carrier wave or other transport mechanism, and includes any information delivery media. A "modulated data signal" can be a signal that has one or more of its characteristics set or changed in such a manner as to encode information in the signal. By way of example, and not limitation, communication media can include wired media such as a wired network or direct-wired connection, and wireless media such as acoustic, radio frequency (RF), infrared (IR) and other wireless media. The term computer readable media as used herein can include both storage media and communication media.

Computing device 900 can be implemented as a portion of a small-form factor portable (or mobile) electronic device such as a cell phone, a personal data assistant (PDA), a personal media player device, a wireless web-watch device, a personal headset device, an application specific device, or a hybrid device that include any of the above functions. Computing device 900 can also be implemented as a personal computer including both laptop computer and non-laptop computer configurations.

The herein described subject matter sometimes illustrates different components contained within, or connected with, different other components. It is to be understood that such depicted architectures are merely examples, and that in fact many other architectures may be implemented which achieve the same functionality. In a conceptual sense, any arrangement of components to achieve the same functionality is effectively "associated" such that the desired functionality is achieved. Hence, any two components herein combined to achieve a particular functionality may be seen as "associated with" each other such that the desired functionality is achieved, irrespective of architectures or intermedial components. Likewise, any two components so associated may also be viewed as being "operably connected", or "operably coupled", to each other to achieve the desired functionality, and any two components capable of being so associated may also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art may translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to inventions containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

What is claimed is:

1. A method of managing data back up at a node comprising:
   identifying at least one file to be backed up from the node, wherein the node includes a local storage partition securely accessible by the node and a cloud storage partition that is accessible by a plurality of peer computers;
   encoding the file into K file segments, wherein K is an integer greater than one;
   requesting at least R * K storage blocks on a cloud storage partition comprised of the plurality of peer computers, wherein R is a redundancy factor; and
   transmitting segments from the node to the plurality of peer computers such that each of the K file segments is stored on at least R peer computers.

2. The method of claim 1, wherein the node is associated with a unique client identifier, the file is associated with a unique file identifier, and segments are associated with unique segment identifiers on an individual basis.

3. The method of claim 1, wherein at least one of the segments does not comprise the file in its entirety.

4. The method of claim 3, wherein less than all of the K segments associated with the file are transmitted to at least one of the peer computers.

5. The method of claim 1, further comprising:
   querying the peer computers to identify segments associated with the file stored on any of the peer computers;
   receiving at least one of the segments associated with the file; and
   reconstructing a copy of the file from the received at least one segments.

6. The method of claim 1, further comprising:
   querying the peer computers to identify segments associated with the file stored on any of the peer computers; and
   if a number of any one of the K segments stored on the peer computers is less than R, transmitting the one of the K segments to one or more of the peer computers such that each of the K segments is stored on R peer computers.

7. The method of claim 1, further comprising:
   encrypting at least one of the segments prior to transmission to the peer computers.

8. The method of claim 1, wherein the file comprises a plurality of data words including a plurality of bits; and wherein an individual segment includes B bits of an individual data word, wherein B is an integer greater than or equal to one and less than K.

9. The method of claim 1, wherein encoding the file into the K file segments includes
   encoding the file using an error detection and correction code, and
   dividing the file into the K file segments such that the file is reconstructed from any K-1 of the file segments.

10. The method of claim 1, wherein encoding the file into K file segments includes
    encoding the file using an error detection and correction code, and
    dividing the file into the K file segments such that, for an integer N, the file is reconstructed from any K-N of the file segments.

11. The method of claim 10, further comprising:
    querying the peer computers to identify segments associated with the file stored on any of the peer computers;
    receiving at least one of the segments associated with the file; and
    if S segments of the K segments are received, wherein S is an integer greater than or equal to one and less than K,
        reconstructing at least one missing segment from the received segments, and
        transmitting the reconstructed missing segment to at least one of the peer computers such that each of the K segments is stored on R peer computers.

12. The method of claim 1, wherein individual segments comprise an error-detecting code.

13. The method of claim 12, further comprising:
    querying the peer computers to identify segments associated with the file stored on any of the peer computers;
    receiving at least one segment associated with the file;
    checking the received at least one segment for error-containing segments using said error-detecting code; and
    if any error-containing segments are identified,
        reconstructing at least one of the error-containing segments from at least one error-free segment, and
        replacing the at least one error-containing segment with an error-free copy on at least one of the peer computers.

14. An apparatus for managing data backup at a node comprising:
    a client computer associated with a unique client identifier, wherein the client computer includes a local storage partition securely accessible by the client computer and a cloud storage partition that is accessible by a plurality of peer computers, the client computer being configured to:
        identify a file for backup from the client computer, the file being associated with a unique file identifier;
        separate the file into K file segments, wherein K is an integer greater than one, wherein individual segments are associated with unique segment identifiers, and wherein no single segment comprises the complete file;
        transmit the segments to a cloud storage partition comprised of the plurality of peer computers such that no single peer computer receives all K segments associated with the file and such that individual segments are received by at least R peer computers, wherein R is a redundancy factor;
        receive from the peer computers at least some of the segments associated with the file; and
        reconstruct the file, based upon at least the unique file identifier and the unique segment identifier, from the received segments.

15. The apparatus of claim 14, wherein the client computer is configured to encrypt at least one of the segments.

16. The apparatus of claim 14, wherein the client computer is configured to separate the file into K file segments by encoding individual bytes of the file into 12-bit Hamming-type code.

17. The apparatus of claim 14, wherein the client is configured to request at least R*K storage blocks on the peer computers.

18. The apparatus of claim 17, wherein the client is configured to request the at least R*K storage blocks on the peer computers from a cloud storage manager; and wherein the client is configured to receive the identities of the peer computers from the cloud storage manager.

19. The apparatus of claim 14, wherein at least one segment comprises an error-detecting code.

20. A storage medium comprising machine-readable instructions stored thereon, which, when executed by one or more processing units, operatively enable a computing platform to:

identify a file stored locally on a client computer node for backup, wherein the node includes a local storage partition securely accessible by the node and a cloud storage partition that is accessible by a plurality of peer computers;

create a plurality of file segments from the file, wherein individual segments comprise less than the complete file, and wherein individual segments comprise an error-detecting code; and transmit individual segments from the node to a cloud storage partition comprised of the plurality of peer computers such that individual segments are stored on at least R peer computers, wherein R is a redundancy factor, and wherein S of the segments are transmitted to individual peer computers, wherein S is an integer greater than or equal to one and less than K.

21. The storage medium of claim 20, wherein the storage medium further comprises machine-readable instructions enabling the computing platform to:

query the peer computers to ascertain which, if any, of the segments is held by each of the peer computers; and for any one of the segments held by one or more R peer computers, transmit the segment to additional peer computers such that the segment is held by R peer computers.

22. The storage medium of claim 20, wherein the storage medium further comprises machine-readable instructions enabling the computing platform to:

request storage blocks on the peer computers;

wherein the plurality of file segments comprises K file segments, wherein K is an integer greater than one; and wherein at least R*K storage blocks are requested.

23. The storage medium of claim 20, wherein the storage medium further comprises machine-readable instructions enabling the computing platform to:

request the storage block on the peer computers from a cloud storage manager; and receive, from the cloud manager, identities of the peer computers associated with the storage blocks.

* * * * *

UNITED STATES PATENT AND TRADEMARK OFFICE
CERTIFICATE OF CORRECTION

Page 1 of 1

PATENT NO.       : 8,370,307 B2
APPLICATION NO.  : 12/551790
DATED            : February 5, 2013
INVENTOR(S)      : Wolfe It is certified that error appears in the above-identified patent and that said Letters Patent is hereby corrected as shown below:

In the Drawings:

In Fig. 6, Sheet 6 of 6, below "PROCESSOR (910)", delete "UP/UC / DSP" and insert -- μP/μC/DSP --, therefor.

In Fig. 6, Sheet 6 of 6, Box (915), in Line 1, delete "MEMORY CONTROLER" and insert -- MEMORY CONTROLLER --, therefor.

In the Claims:

In Column 13, Line 1, in Claim 20, delete "client computer node" and insert -- node --, therefor.

Signed and Sealed this
Eighteenth Day of June, 2013

Teresa Stanek Rea
*Acting Director of the United States Patent and Trademark Office*